United States Patent
Politi

(10) Patent No.: US 6,738,611 B1
(45) Date of Patent: May 18, 2004

(54) IMAGE REJECTION SUB-HARMONIC FREQUENCY CONVERTER REALIZED IN MICROSTRIP, PARTICULARLY ADAPTED TO BE USE IN MOBILE COMMUNICATION EQUIPMENTS

(75) Inventor: Marco Politi, Milan (IT)

(73) Assignee: Siemens Mobile Communications S.p.A, Milan (IT)

( * ) Notice: Subject to any disclaimer, the term of this patent is extended or adjusted under 35 U.S.C. 154(b) by 0 days.

(21) Appl. No.: 09/508,200

(22) PCT Filed: Sep. 14, 1998

(86) PCT No.: PCT/EP98/05865

§ 371 (c)(1),
(2), (4) Date: Apr. 25, 2000

(87) PCT Pub. No.: WO99/14853

PCT Pub. Date: Mar. 25, 1999

(30) Foreign Application Priority Data

Sep. 15, 1997 (IT) .......................... MI97A2085

(51) Int. Cl.$^7$ ................................ H04B 1/10
(52) U.S. Cl. ................ 455/302; 455/327; 455/296; 455/326; 333/296; 333/116; 333/26
(58) Field of Search ................. 455/302, 325, 455/327, 326, 296, 130, 305, 330, 333, 334; 333/26, 204, 296, 116

(56) References Cited

U.S. PATENT DOCUMENTS

| | | | | |
|---|---|---|---|---|
| 3,624,513 A | * | 11/1971 | Costas | 455/302 |
| 3,939,430 A | * | 2/1976 | Dickens et al. | 455/302 |
| 4,099,126 A | * | 7/1978 | Hallford | 455/326 |
| 4,118,670 A | * | 10/1978 | Dickens | 455/327 |
| 4,435,848 A | * | 3/1984 | Sedlmair | 455/327 |
| 4,651,344 A | * | 3/1987 | Hasegawa et al. | 455/325 |
| 4,654,887 A | * | 3/1987 | Murphy et al. | 455/327 |
| 4,731,875 A | * | 3/1988 | Mizukami et al. | 455/302 |
| 5,015,976 A | * | 5/1991 | Saka | 333/204 |
| 5,020,148 A | * | 5/1991 | Bonato | 455/302 |
| 5,416,449 A | * | 5/1995 | Joshi | 332/170 |

FOREIGN PATENT DOCUMENTS

| | | |
|---|---|---|
| DE | 2608939 | 9/1977 |
| EP | 20322612 | 7/1989 |
| EP | 0581573 A1 | 2/1994 |

OTHER PUBLICATIONS

PTO 02–4919, translation to English from DT 26 08 939 A1 by FLS, Inc. (pp. 1–15).*
Bonato P: Proceedings of the European Microwave Conference, London, Sep. 4–7, 1989, No. Conf. 19, Sep. 4, 1989, pp. 719–724 (XP000067343).

* cited by examiner

*Primary Examiner*—Sonny Trinh
(74) *Attorney, Agent, or Firm*—Birch, Stewart, Kolasch & Birch, LLP

(57) ABSTRACT

It is described an image rejection, sub-harmonic frequency converter, realized in microstrip, particularly adapted to be used in mobile communication equipment, The converter avails of two identical sub-harmonic mixers employing each one or two pairs of diodes in antiparallel, obtained on a same silica substrate, and of a structure of hybrids performing appropriate phase combination adapted to suppress the image band in the converted signal. The mixers include filtering structures preferably consisting, but no limited to the same, of stubs λ/4 long, at the local oscillator frequency, having a free end, in short or open circuit, respectively. According to an alternative embodiment, said stubs are replaced by appropriate filters implemented with concentrated structures (L and C) performing the same transfer function of the stubs in microstrip. The sub-harmonic converter and a traditional converter can be jointly employed in a terminal mobile equipment operating in "Dual Mode service hand-held" (GSM 900 and DCS 1800) sharing a unique 900 MHz local oscillator.

11 Claims, 2 Drawing Sheets

IMAGE REJECTION SUB-HARMONIC FREQUENCY CONVERTER REALIZED IN MICROSTRIP, PARTICULARLY ADAPTED TO BE USE IN MOBILE COMMUNICATION EQUIPMENTS

This application is the national phase under 35 U.S.C. § 371 of PCT International Application No. PCT/EP98/05865 which has an International filing date of Sep. 14, 1998, which designated the United States of America.

FIELD OF THE INVENTION

The present invention relates to the field of equipment for telecommunications where a frequency conversion of signals transmitted, or received is required, and more in particular to an image rejection sub-harmonic frequency converter realized in microstrip, particularly adapted to be used in mobile communication equipment.

BACKGROUND ART

The conversion around a desired frequency is known to be obtained through "multiplication" of a signal occupying a useful band to be converted and a sinusoidal signal of local oscillator OL at $f_{OL}$ frequency duly determined. The multiplication is made allowing the two signals to reach the ends of one or more non-linear devices, called mixers, such as for instance Schottky diodes, and drawing the desired conversion products from the same. From the analytical point of view, the non-linear conductance of the diodes can be developed in series of powers of values of the input current. Considering at the beginning said current as a superimposition of a pair of sinusoidal components of $f_{OL}$ and $f_{RF}$ frequencies, in the case of down conversion, or of $f_{OL}f_{IF}$ frequencies, in the case of up conversion, it shall be obtained on the load, in addition to the input components, also new components generated by the diodes themselves at frequencies expressed by all possible combinations of two integer numbers m, n independent between them, $mf_{OL} \pm nf_{RF}$ in the first case, or $mf_{OL} \pm nf_{IF}$ in the second case, respectively. The extension to the cases in which the current of the diodes includes all the components belonging to the whole band of RF and IF signals is immediate.

As it can be noticed in both the cases, the converted signal includes, in addition to the desired useful signal (in general obtained through m=n=1), an infinite quantity of $mf_{OL}$ terms and of relevant conversion products of growing order that result symmetrically arranged, due to the sign ±, around the $mf_{OL}$ frequencies.

In the case of transmission it is essential to filter the conversion products, placed outside the useful band since the same represent out-of-band spurious emissions, severely prohibited by the international regulations. In microwave applications, only one of the two side bands is generally transmitted to the double purpose of saving transmission power and reduce the band occupation. The other band, called image, being symmetrical versus the frequency $mf_{OL}$, is usually suppressed like the signal of local oscillator at the frequency $mf_{OL}$ that is suppressed for the same reasons. It is of particular importance that one part at least of said suppression occurs before the converted signal enters the power amplification stages placed downstream the conversion stage (generally capable to equitably process both the side bands), to avoid linearity losses in the operation of the mixers and distortions caused by saturation of the power terminals.

As for reception, the signal IF at intermediate frequency is generated by the superimposition of the conversion products of the useful and image band of the RF signal. In the very frequent case in which the RF signal consists of a plurality of adjacent channels transmitted to unique side band, the conversion at intermediate frequency of the image band is an undesired effect, so that it is necessary to eliminate the image band through appropriate radiofrequency band pass filtering before the conversion, So, it is attained the purpose to avoid that the signal, or the noise present in the image band, are they too converted in the intermediate frequency band, causing superimposition or easing the worsening of the receiver characteristics.

The converters mentioned above belong to a first type, called "double side band" and according to what said above they require a radiofrequency image filter whose realization is always complex, if one wants to maintain the useful signal unchanged, due to the closeness existing in all the embodiments of transceivers, between the two $mf_{OL}$ and $f_{RF}$, frequencies, both much higher than the $f_{IF}$.

Concerning the problem of the suppression of the components at frequency $mf_{OL}$ generated by the mixer, a first possible method is that to extend the rejection band of the image filter up to including again the relevant $mf_{OL}$ frequency components. However, should the mixer belong to a mo-demodulator of the orthogonal type (I, Q), performing the direct conversion from base band to radiofrequency, and vice versa, this approach is no more possible to be actualised since the image band does not exist and the $mf_{OL}$ component is at band centre of the RF signal.

A second known method to suppress the $mf_{OL}$ frequency components generated by the mixer, valid also for mo-demodulators, is to use two mixers, instead of one, and a balun to combine in counterphase the above mentioned components of each mixer. The main drawback of this solution is the difficult realization of a broad band operating balun, particularly at the highest frequencies; the maximum rejection that can be obtained is 30 dB approximately on 10% relative bands.

A third method, also known, to suppress the $mf_{OL}$ frequency components generated by the mixer, is to use a simple or double balanced structure. The two configurations are respectively obtained though a pair of diodes in antiparallel, or through a four-diode link enabling a better balancing. The rejection degree is as much higher as the physical characteristics of diodes result equal among them. Through an adequate driving of the diodes in these configurations, it is possible for instance to obtain the global transconductance including only the even order harmonics of the frequency $f_{OL}$. In this case, conversion products are of the 2 $mf_{OL} \pm nf_{RF}$ kind only, for the down converter, or 2 $mf_{OL} \pm nf_{IF}$ for the up converter, lacking for what said above, the terms 2 $mf_{OL}$ in the converted signal. This means that, in the case of reception, applying a local oscillator signal OL at $f_{OL}$ frequency to the balanced mixer, a signal at frequency 2 $mf_{OL} + nf_{RF}$ is converted at intermediate frequency $f_{IF}$ with the same conversion losses that would be obtained with use of a non-balanced mixer driven at the frequency 2 $mf_{OL}$. Since we consider of practical interest, at least to the purposes of the invention that shall be described, only the lowest conversion order, obtained coinciding with m=n=1, we can consider the above mentioned converters as devices able to operate a conversion with local oscillator at $f_{OL} = \frac{1}{2}$ ($f_{RF} + f_{IF}$) frequency, or at halved frequency compared to that of local oscillators operating with the conventional converters and for this reason they are called also sub-harmonic converters. Their use involves different advantages, among which:

capability to operate at the highest frequencies with less expensive local oscillators, because as the frequency increases it is difficult to implement at low cost stable local oscillators capable to output the power required for the good operation of the mixers;

a high rejection degree of the residual components at $^2f_{OL}$ frequency in the converted signal, said rejection being due only to the balancing degree of the structure, that is by the coupling degree of the physical parameters of the diodes used in the mixer, rather than on the response in frequency of external networks;

a less difficult filtering of the components at the frequency $f_{OL}$, considering the higher distance between $f_{OL}$ and the band of the useful signal at radiofrequency.

There is a second type of frequency converters differing from the type of converters mentioned up to now, due to the fact that the converters belonging to the same do not require the image filter placed at the port of the radiofrequency signal. This result is due to the adoption of a particular circuit configuration of hybrids that enables to obtain, or to use, only one of the two side bands of the RF signal. For this reasons, the converters of the second type are called "single side band", or image rejection or suppression ones. The converters of the second type can also be implemented using sub-harmonic mixers, in this case the advantages of the converters of the first and second type are combined. Said advantages mainly derive from the use of a local oscillator frequency halved compared to that of conventional converters and at the same time, from the lack of the image filter. The scope of the present invention is an image rejection sub-harmonic converter realized in microstrip, and therefore having all the above mentioned advantages An example of this is already known and is described in the European patent No. 322612 under the name of the same applicant, titled "Microwave image suppression harmonic frequency converter."

The mentioned converter is realized in microstrip and includes two identical harmonic balanced mixers, each one consisting of a pair of Schottky diodes connected in antiparallel, a first directional coupler in quadrature at radiofrequency, a second directional coupler in quadrature at intermediate frequency, two appropriate duplexer filters, two low-pass filters, two matching circuits and two uncoupling circuits. The first directional coupler in quadrature at radiofrequency being of the tandem type, with half-open structure and forming part of a new circuit structure whose purpose is to overcome the implementation complexity of a traditional coupler of the Lange type, used in a previous invention, in the ranges 15, 18 and 23 GHz. The structure indicated does not require a third coupler, generally used to couple the local oscillator OL signal to the mixers. The layout of the mentioned converter is particularly optimized for the ranges indicated, where the advantages of its use are considerable, however for lower use ranges, such as for instance those employed in the mobile GSM (Global System Mobile) and DCS (Digital Cellular System) systems, 900 and 1800 MHz, respectively, the Lange coupler hybrids do not show realization difficulties such to justify the invention described above. In this case the relevant layout could result too large due to the complexity of the filters and the large size the half-open structure tandem coupler would have.

OBJECT OF THE INVENTION

Object of the present invention is to overcome the above mentioned drawbacks and to indicate an image rejection sub-harmonic frequency converter whose layout in microstrip results of small size and simple to realize in the frequency ranges used in the mobile communication GSM and DCS, advantages obtained through a new combination of means employing traditional hybrids rather than inventive hybrids as in the mentioned background art, and filtering structures reduced to simple stubs or to filters made at concentrated parameters. For description sake, but without departing from the scope of the invention, reference is made hereinafter only to the circuit employing stubs in λ/4.

SUMMARY OF THE INVENTION

The above object is solved by the combination of features of the claim 1 regarding an image rejection sub-harmonic frequency converter, microstrip realized, particularly for use in mobile communication systems, characterized in that it includes:

a) a first double side band frequency sub-harmonic mixer consisting of antiparallel diodes placed between a first and a second filtering structure connected to relevant microstrips connecting at one end of said diodes a first port, reached by a local oscillator signal OL, and at the other end a second port for a radiofrequency signal RF; said mixer including also a third port for a signal at intermediate frequency IF, connected to one end of said diodes in antiparallel through a low-pass filter that allows said signal at intermediate frequency IF to pass and blocking said OL and RF signals;

b) a second frequency mixer identical to said first mixer;

c) a first 3 dB, 0° directional coupling circuit at local oscillator frequency, coupling said OL signal to said first ports of said frequency mixers;

d) a second 3 dB, 90° directional coupling circuit at radiofrequency, Lange coupler type, or equivalent, coupling said signal RF to said second ports of said frequency mixers;

e) a third 3 dB, 90° directional coupling circuit at intermediate frequency coupling said signal IF to said third ports of said frequency mixers.

In some known applications, it was noticed that the structure of directional couplers, called also hybrids, differ from that of the present invention due to the fact that the hybrid at local oscillator frequency is 3 dB, 45° and the radiofrequency hybrid is at 3 dB, 0°; in such a way the total phase shifting at 2 $f_{ol}$ frequency is 90°, as it must be to define the correct phase relation enabling to sum in counterphase the image band. This solution shows a narrower rejection band versus the structure of hybrids according to the invention since, while the realization of broad band 3 dB, 0° and 3 dB, 90 is rather simple, that of a 3 dB, 45 hybrid is not so simple. Among those application there is the document DE-A-2 608 939, which appears to be the closest prior art. In the cited application a stripline mixer both sub-harmonic and image rejection is disclosed. The mixer uses two 3 dB couplers, or hybrid rings, for coupling IF and OL signals at two respective ports of two symmetric couple of diodes in antiparallel acting as a balanced mixer, while RF signal is fed directly to the diodes. A delay line L dimensioned in a way to introduce 45° phase displacement at the OL frequency is inserted between one output of the OL hybrid and the OL port of a couple of diodes. Each couple of antiparallel diodes is connected at one end to a short-circuited quarter wavelength line, at the OL sub-harmonic frequency, and at the other end to an open line of the same electrical length. The outlined drawbacks don't entirely apply to the mixer of D1, but the introduction of the delay line L, due to the particular combination of hybrid circuits, is an additional complication which doesn't afflict our mixer.

In the mobile communication field, the converter structure described in the claim 1 enables to obtain the following system advantages, compared to the present use of the traditional converters:

minimum occupation of the substrate at use frequencies, if the frequency is high, it is convenient to realize the structure with stubs, otherwise it is convenient for space requirements, to realize the filtering structures through concentrated parameters L and C;

absence, or about, of residual interferingt components at the frequency 2 $f_{OL}$ in the radiofrequency signal RF, and easy filtering of the local oscillator component at $f_{OL}$;

best rejection of the image band and easy filtering of a possible residue;

when 4 diodes are used in antiparallel configuration by pairs, the linearity of the device implemented improves.

higher accuracy in the execution of the frequency hopping: it is useful to point out that the frequency hopping is a planned frequency jump of the carrier assigned to a generic radio channel, made at each time slot, to prevent on a statistical basis the dangerous effects due to quick fadings of the radio signal caused by multiple paths (Rayleigh fading), or by other interference causes. The higher accuracy derives from the fact that, compared to a traditional converter, it is necessary one half of the total phase variation, at equal Δt, to obtain the same frequency jump Δf. This involves the possibility to use a higher linearity area of the voltage/frequency transfer feature of the voltage controlled oscillator, or VCO, physically implementing the frequency hopping or,. alternatively, the possibility to use VCOs having less stringent characteristics of linearity, tuning interval and bandwidth.

simplification in the introduction of the operation method called "Dual Mode" through which a same terminal equipment can switch its operation from a GSM 900 MHz type network to one of the DCS 1800 MHz type. In fact, it is possible to use one sole local oscillator at frequency (900+$f_{FI}$) MHz to supply two converters, out of which the first of the traditional type (the one for the GSM), and the second one of the sub-harmonic type (that for DCS 1800 MHz).

Concerning this last advantage, it is possible to configure another object of the invention consisting of a mobile terminal equipment with the possibility to switch its own operation from a first mobile system to a second mobile system operating in an higher area of the radiofrequency spectrum, and vice versa, characterized in that it includes one sole local oscillator and switching means of the local oscillator signal towards a traditional frequency converter included in a radio chain belonging to said first mobile system, or towards an image rejection sub-harmonic frequency converter of the claim 1 included in a radio chain belonging to said second mobile system, as described in claim 6.

A mobile terminal equipment with switching band capability is disclosed in the European patent application EP-A-0 581 573. The invention concerns an universal radio telephone whose circuital arrangement includes three independent PLL circuits: two first for generating UHF local oscillator signals for driving the reception and transmitting frequency converters, and a third VHF one for driving a digital (I, Q) modulator/demodulator. The VCOs embedded in the two UHF PLLs drive respective multiplier means (11, 12) electronically controlled for either selecting the fundamental or the second harmonic of the driving signals. The UHF signals selected by multplier means (11, 12) fed the local oscillator input of up and down conversion mixers respectively. Only one intermediate frequency IF is used in the reception branch.

The approach to effect "dual mode" in the cited invention consists of keeping unchanged the mixer operating mode and change the frequency of the driving OL signal, in case, by the selection of the second harmonic generated from the output of the OL oscillator. Lacking a description of the multiplier means (11, 12), the selection of the second harmonic is supposed obtained by filtering out a second harmonic generated from a non-linear device the UHF signal goes through. This approach, omitting for sake of simplicity the relevant shortcomings, is quite different from our method to implement "dual mode" in which the local oscillator frequency is kept constant and the mixer used in the radio chain is switched from a traditional to a sub-harmonic one.

From the description of the invention given up to now it can be noticed that it is sufficient to suppress the 3 dB, 90° directional coupler at intermediate frequency, replace the 3 dB, 90° directional coupler at radiofrequency with a 3 dB, 0° one, and replace in each mixer the low-pass filter allowing signal at intermediate frequency IF to pass by a low-pass filter coupled to the transmission pulse, because the remaining structure of the converter be suitable to be used also as sub-harmonic mo-demodulator of the orthogonal type (I, Q), able to convert the signal in base band directly to radiofrequency, and vice versa.

Therefore a further object of the invention is an orthogonal sub-harmonic mo-demodulator, as described in claim 7, which could find application in future implementations of mobile systems.

BRIEF DESCRIPTION OF DRAWINGS

The invention, together with further objects and advantages thereof, may be understood with reference to the following detailed description taken in conjunction with the accompanying drawings, in which.

DETAILED DESCRIPTION

Figure 1:
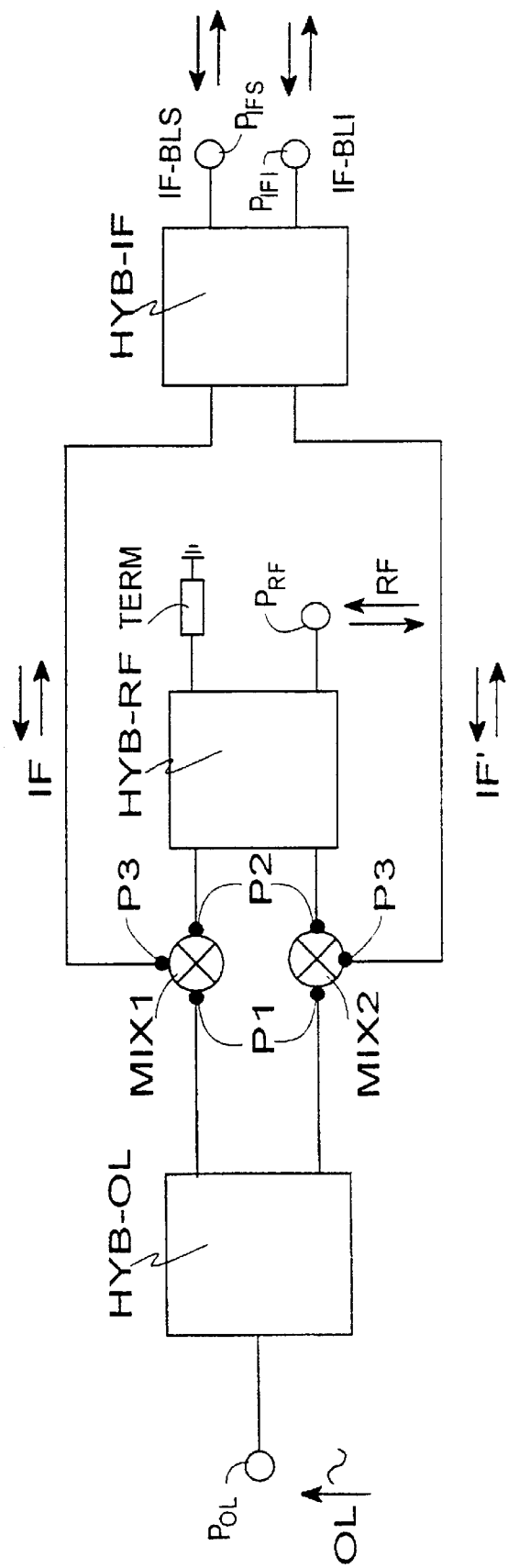
FIG. 1 shows a block diagram of the image rejection sub-harmonic converter, object of the present invention.

Making reference to FIG. 1 it can be noticed a frequency converter consisting of the following functional blocks:

a) a first 3 dB, 0° broad band directional coupler HYB-OL at the frequency $f_{OL}$ of a local oscillator signal OL entering from a relevant port $P_{OL}$;

b) a second broad band directional coupler HYB-RF at 3 dB, 90° at the frequency of band centre $f_{RF}$ of a radiofrequency signal RF entering or coming out from a relevant port $P_{RF}$;

c) a third broad band directional coupler HYB-IF at 3 dB, 90° at intermediate frequency $f_{IF}$, duly determined, of a signal at intermediate frequency IF-BLS, or IF-BLI, entering or coming out from a relevant port $P_{IFS}$, O $P_{IFI}$; and d) two identical frequency sub-harmonic mixers MIX1 and MIX2.

The directional couplers are of the known type, realized in microstrip or at concentrated parameters, the second coupler is of the Lange type and its operation is similar to that of the third one, that is such for which a signal present at a generic port is found at the two opposite ports as pair of half power signals, reciprocally phase shifted by 90°; no signal is present at the port adjacent to the signal application one. The operation of the first one differs from the previous one due to the fact that signals present at the two opposite ports are in phase.

As for the global operation, the OL signal enter the HYB-OL block and is here subdivided into two identical output signals sent to a relevant port P1 of the mixers MIX1 and MIX2. The double side band RF signal, assumed to enter the block HYB-RF, is equally shared in power over the two outputs of the coupler originating two radiofrequency signals, 90° phase shifted between them, allowed to reach a relevant port P2 of mixers MIX1 and MIX2. The port of HYB-RF placed on the same side of the port $P_{RF}$ is closed on a termination TERM connected to earth. At a last port P3 of mixers MIX1 and MIX2, in the previous assumptions, a relevant beating signal comes out between RF and the second harmonic of the sinusoidal signal OL. The beating signals at intermediate frequency, identified IF and IF', reach relevant ports adjacent to the directional coupler HYB-IF. At the other two ports of HYB-IF, due to the phase clearance at the frequency of the two side bands, the signals IF-BLS and IF-BLS are separately present, generated by the conversion at intermediate frequency of the upper and lower band respectively of the IF signal. On the other hand, considering the use of the converter in transmission, the operation results dual compared to the one just described. More in particular, the signal at intermediate frequency to be transmitted (one single side band) shall be allowed to reach a single port at choice, for instance $P_{IFS}$, of the directional coupler HYB-IF, the other port shall be closed on a termination. As a consequence of the phase clearance mentioned above, a single upper side band transmission RF signal will come out from the radiofrequency $P_{RF}$ port of the HYB-RF coupler. On the contrary, selecting $P_{IFI}$, the band transmitted shall be the lower one.

Figure 2:
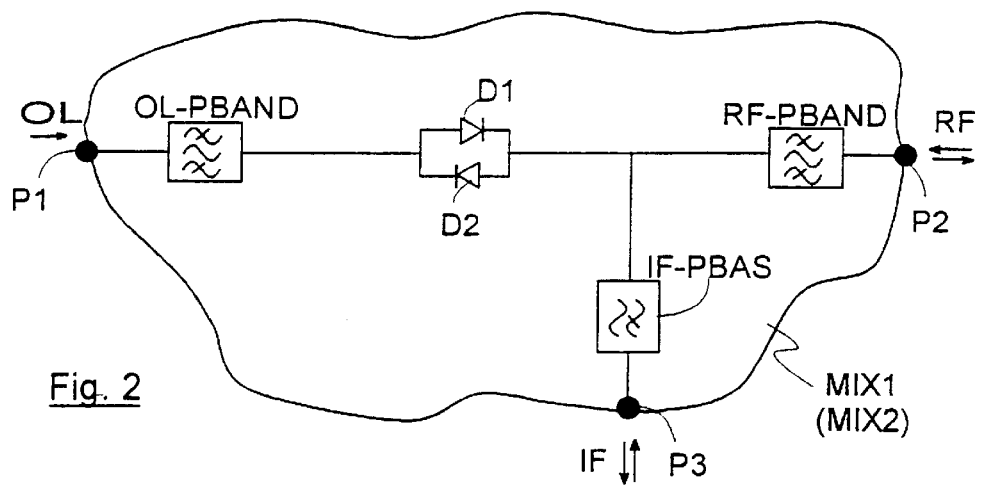
FIG. 2 is a block diagram showing the functional detail of two identical frequency mixers identified MIX1 and MIX2 in FIG. 1.

Making reference to FIG. 2, in which the same elements of FIG. 1 are indicated with the same symbols, it can be noticed that mixers MIX1 and MIX2 include the following:

a band pass filter OL-PBAND at the frequency $f_{OL}$ of the signal of local oscillator OL having a virtual shortcircuit for the radiofrequency signal RF on the diodes side;

a band pass filter RF-PBAND at the frequency $f_{RF}$ of the radiofrequency signal RF having a virtual shortcircuit for the local oscillator signal OL on the diodes side;

a low-pass filter IF-PBAS at the frequency $f_{IF}$ of the signal at intermediate frequency IF;

a pair of diodes D1, D2 connected in antiparallel, supplied as unique integrated component.

The OL-PBAND filter is placed between port P1 and one end of the pair of diodes D1, D2 and allows the OL signal to pass while blocking the RF and IF signals. The RF-PBAND filter is placed between the port P2 and the other end of the pair of diodes D1, D2 and allows the RF signal to pass while blocking the OL and IF signals. The filter IF-PBAS is placed between the port P3 and the end of the pair of diodes D1, D2 to which also the RF-PBAND filter is connected, but it can also be connected to the other end as well allowing the IF signal to pass while blocking the OL and RF signals. The purpose of these filters is to enable the correct operation of the relevant mixers keeping separate the signals at the three ports P1, P2 and P3. The band pass features of the OL-PBAND and RF-PBAND filters must be such to considerably attenuate the signals in dark band. Concerning the sub-harmonic conversion operated by the pair of diodes D1 and D2, reference shall be made to what said in the introduction, considering that for a better "linearity" in the converter signal it is useful to replace the pair of diodes by an integrated one including four diodes in quad configuration, in practice each diode shall be replaced by two diodes in series.

Figure 3:
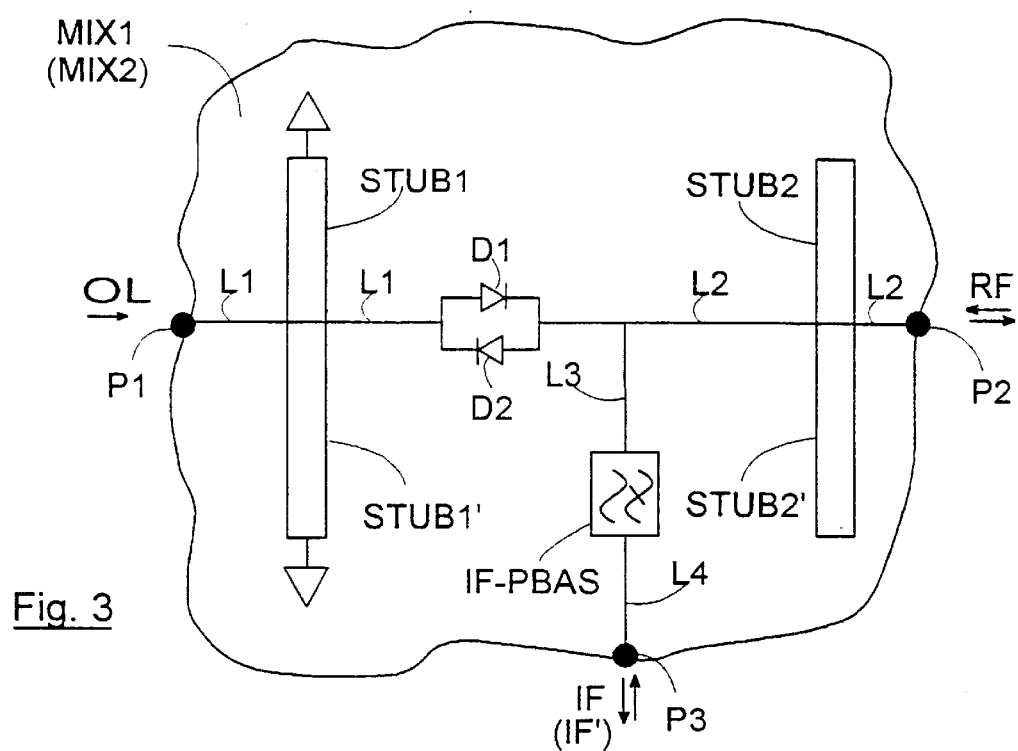
FIG. 3 shows a circuit realization of the mixers MIX1 and MIX2 of FIG. 2.

The circuit implementation of the functional diagram of FIG. 2 is shown in FIG. 3 through a mixed representation, partly in microstrip and partly in blocks. The dimensions of the circuit elements shown in the figure, as well as the respective distances, do not exactly correspond to the actual ones, since the figure is given only for illustration purposes.

Making reference to FIG. 3, in which the same elements of the previous figures are indicated with the same symbols, we can notice two pairs of stubs in microstrip, identified STUB1, STUB1' respectively those of the first pair placed close to port P1, and STUB2, STUB2' those of the second pair placed closed to port P2. More in particular, the stubs of the first pair branch in perpendicular direction and in opposed directions from a microstrip L1 connecting the port P1 to an end of the pair of diodes; likewise, the stubs of the second pair branch in perpendicular direction and in opposed direction from a microstrip L2 connecting the port P2 to the other end of the pair of diodes. A third microstrip L3 branches from line L2, between the second pair of stubs and the pair of diodes, reaching a port of the IF-PBAS filter, microstrip realized through coupled lines in case of high IF, on the contrary in case of low IF it is convenient to realize also this filter at concentrated parameters, the other port of the IF-PBAS filter is connected to port P3 through a microstrip L4. As already said before, the microstrip L3 could alternatively branch from the line L1. The stubs STUB1, STUB1', STUB2 and STUB2', are sections of line $\lambda/4$ long, where $\lambda$ is the wavelength of a sinusoidal signal at the frequency $f_{OL}$ of local oscillator. The free end of STUB1 and STUB1' is connected to earth, while the free end of STUB2 and STUB2' is open.

Figure 4:
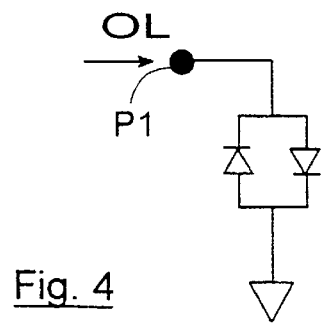
FIGS. 4 and 5 show two equivalent circuit seen from the ports P1 and P2 respectively of mixers of FIG. 3.
Figure 5:
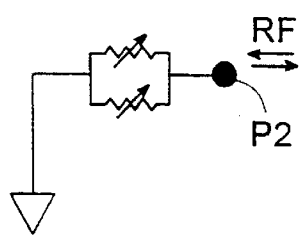

As for the operation, the selection of two double stubs, in place of single ones, enables to obtain a higher band width in the conversion. Furthermore, as it is known, the stubs in $\lambda/4$ act as impedance transformers in a whole surrounding band, at the frequency for which they assume that length, that is around $f_{OL}$. In particular a shortcircuit is reported as open short circuit in the stub insertion point, vice versa, an open circuit is reported as a shortcircuit. Consequently, concerning the OL signal, the first pair STUB1, STUB1' behaves as a high impedance, while the second pair STUB2, STUB2' as a shortcircuit. FIG. 4 shows the equivalent circuit of mixers MIX1, MIX2 seen at port P1 of local oscillator. Let's now consider the behaviour of the stubs for the radiofrequency signal RF. Recalling what said in the introduction on the relations among the different frequencies in a sub-harmonic converter, it can be noticed that the stubs of the pairs have length $\lambda/2$ approx. at the band centre frequency $f_{RF}$ of the RF signal. As it is known, the stubs having this length do not transform the impedance, but only change the relevant sign. Therefore, the RF signal sees a high impedance in the insertion point of the second pair of stubs, and a shortcircuit in the insertion point of the first pair. The equivalent circuit of mixers MIX1, MIX2 seen at port P2 of the RF signal is the one shown in FIG. 5, where diodes are represented by two relevant resistances variable in parallel, connected between the port P2 and the earth. Thanks to the presence of the two pairs of stubs, the length of microstrips L1 and L2 is negligible.

Without departing from the scope of the invention, it is possible to implement the stubs in λ/4 STUB1, STUB1' and STUB2, STUB2' with alternative structures, known to those skilled in the art, such as for instance the so-called "butterfly stubs".

For a better clarification, in the case of mobile GSM 900 MHz the values of the frequencies concerning the converter subject of the present invention are the following:

$f_{LO}$=417,5 MHz, $f_{IF}$=45 MHz, $f_{RF}$=880 MHz and bandwidth 35 MHz;

while in the case of DCS 1800 MHz frequency values are the following:

$f_{LO}$=832,5 MHz, $f_{IF}$=45 MHz, $f_{RF}$=1710 MHz and bandwidth 75 MHz.

We shall now return to what said about the possibility of an application of the converter scope of the present invention in cellular telephone sets, of the terminal type, operating in "Dual Mode". It is evident that the condition to satisfy in order that this can be made at low cost is that the two mobile systems have frequency bands allocated in areas of the spectrum with distance approximately double of the origin of the frequencies. This requirement is directly due to the characteristic operation of the harmonic converter. Afterwards, with a single local oscillator it is possible to pump either the mixer of the traditional converter belonging to the radio chain of the GSM 900 MHz, or that of the sub-harmonic converter belonging to the radio chain of the combined system, thus saving supply power compared to the systems employing two different local oscillators, and extending the duration of the battery charge. To allow said use of a sole local oscillator to become operational, means are required switching the local oscillator signal from a converter to the other one. The above mentioned means could avail of the usual setting from keyboard with monitoring of the operative condition on the display of the portable set and include also a switch of the OL signal, software controlled, actually performing the switching. Notice that it is not required a perfectly double distance between the frequency bands of the two systems, it is sufficient that one half of the distance between the second harmonic 2 $f_{OL}$ and the $f_{RF} \pm f_{IF}$ frequency of the mobile system adopting the higher frequencies falls into the tuning interval of the VCO acting as local oscillator, whenever this way is selected. However, it is preferred for system reasons, to adopt a fixed frequency local oscillator and consider an intermediate frequency of the second mobile system different from that of the previous one. Assuming this last possibility, the new system would result operative immediately on switching, while in the first hypothesis it should be necessary to set the new frequency of the VCO. It is obvious that as many types of GSM 900 MHz mobile terminal sets operating in "Dual Mode" dual mode can exist as are the combinations possible with the other existing systems. The system combined to the GSM 900 MHz can be, for instance: the DCS 1800 MHz, the 1700 MHz DECT (Digital Enhanced Cordless System), the 1900 MHz PCN (Personal Communication Network), etc.

Returning to FIG. 1, it is now examined the possibility to implement a sub-harmonic mo-demodulator of the orthogonal type (I, Q), able to convert the signal directly mo-demodulated from base band to radiofrequency, and vice versa. To this purpose it is sufficient to eliminate the directional coupler HYB-IF, and make the ports $P_{IFS}$ and $P_{IFI}$ coincide with the ports P3 of mixers MIX1 and MIX2. In the modified structure the ports P3 shall respectively be concerned to components in phase 1, and in quadrature Q, in base band corresponding to symbols coded according to a generic scheme of modulation in quadrature, originated by bursts of information bits. Of course it is necessary to replace the IF-PBAS filter in both the mixers MIX1 and MIX2 by a low-pass filter coupled to the transmission pulse. Furthermore the 3 dB, 90° radiofrequency hybrid HYB-RF shall be replaced with a 3 dB, 0° one for doesn't change the quadrature phase displacement between the two RF components at the ports P2. In the case the modified structure is used as direct modulator, symbols I and Q will enter the ports P3, on the contrary in case of use as direct demodulator said components will come out.

While particular embodiments of the present invention have been shown and described, it should be understood that the present invention is not limited thereto since other embodiments may be made by those skilled in the art without departing from the scope thereof. It is thus contemplated that the present invention encompasses any and all such embodiments covered by the following claims.

What is claimed is:

1. Image rejection sub-harmonic frequency converter, particularly for use in mobile communication systems, characterized in that it includes:

a) a first double side band frequency sub-harmonic mixer (MIX1) consisting of diodes in antiparallel (D1, D2) placed between a first and a second filtering structure (STUB1, STUB2) connected to relevant microstrips (L1, L2) connecting at one end of said diodes a first port (P1), reached by a local oscillator signal OL, and at the other end a second port (P2) for a radiofrequency signal RF; said mixer (MIX1) including also a third port (P3) for a signal at intermediate frequency IF, connected to one end of said diodes in antiparallel through a third filtering structure, of the low-pass type (IF-PBAS), allowing said signal at intermediate frequency IF to pass and blocking said OL and RF signals;

b) a second frequency mixer (MIX2) identical to said first mixer (MIX1);

c) a first 3 dB directional coupling circuit, 0° at the local oscillator frequency (HYB-OL), coupling said OL signal to said first ports (P1) of said frequency mixers (MIX1, MIX2), d) a second directional coupling circuit 3 dB, 90° at radiofrequency of the Lange coupler type, or equivalent, (HYB-IF) coupling said signal RF to said second ports (P2) of said frequency mixers (MIX1, MIX2);

e) a third directional coupling circuit 3 dB, 90° at intermediate frequency (HYB-IF) coupling said signal IF to said third ports (P3) of said frequency mixers.

2. Sub-harmonic converter according to claim 1, characterized in that said first and second filtering structure consist of a first and a second stub (STUB1, STUB2) structured in such a way that the first stub (STUB1) is shortcircuited to earth at a free end and has length λ/4 at the frequency of said signal OL, while the second stub (STUB2) is open at a free end and has a length λ/4 at the frequency of said signal OL.

3. Sub-harmonic converter according to claim 2, characterized in that said first and second filtering structure consist of circuits at concentrated parameters L and C adapted to perform the same transfer function of said first and second stub.

4. Sub-harmonic converter according to claim 2, characterized in that said stubs (STUB1, STUB2) are double and branch in perpendicular direction and in opposed directions from relevant said microstrips (L1, L2), thus increasing the bandwidth of said frequency mixers (MIX1, MIX2).

5. Sub-harmonic converter according to claim 1, characterized in that said diodes in antiparallel (D1, D2) consist of pairs of diodes in series placed in antiparallel.

6. Mobile terminal set with possibility to switch its operation from a first mobile system to a second mobile system operating in an higher area of the radiofrequency spectrum, and vice versa, characterized in that it includes one single local oscillator and switching means of the local oscillator signal towards a traditional frequency converter included in a radio chain belonging to said first mobile system, or towards the image rejection sub-harmonic frequency converter of the claim 1 included in a radio chain belonging to said second mobile system.

7. Orthogonal sub-harmonic mo-demodulator, microstrip realized, characterized in that it includes:

a) a first double side band frequency sub-harmonic mixer (MIX1) made of diodes in antiparallel (D1, D2) placed between a first and a second filtering structure connected to relevant microstrips (L1, L2) connecting at one end of said diodes a first port (P1), reached by a local oscillator signal OL, and at the other end a second port (P2) for a radiofrequency signal RF; said mixer (MIX1) including also a third port (P3) for a component in phase, or in quadrature, of a symbol in base band, connected to one end of said diodes in antiparallel though a base band, connected to one end of said diodes in antiparallel though a third filtering structure, of the low PR pass type (IF-PBAS), coupled to the transmission pulse, blocking said OL and RF;

b) a second frequency mixer (MIX2) identical to said first mixer (MIX1), whose said third port being available for a said component in quadrature, or in phase, of a symbol in base hand;

c) a first 3 dB, 0° directional coupling circuit at the frequency of local oscillator (HYB-OL), coupling said signal of OL to said first ports (P1) of said frequency mixers (MIX1, MIX2);

d) a second 3 dB, 0° directional coupling circuit at radiofrequency (HYB-RF) coupling said signal RF to said second ports (P2) of said frequency mixers (MIX1, MIX2);

e) a third directional coupling circuit at 3 dB, 90° at intermediate frequency (HYB-IF) coupling said signal IF to said third ports (P3) of said frequency mixers.

8. Sub-harmonic mo-demodulator according to claim 7, characterized in that said first and second filtering structure consists of a first and a second stub (STUB1, STUB2) structured in such a way that the first stub (STUB1) is shortcircuited to earth at a free end and has a length equal to $\lambda/4$ at the frequency of said signal OL; while the second stub (STUB2) is open at a free end and has length $\lambda/4$ at the frequency of said OL.

9. Sub-harmonic mo-demodulator according to claim 8, are characterized in that said first and second filtering structure consist of concentrated parameter circuits L and C adapted to realize the same transfer function of said first and second stub.

10. Sub-harmonic mo-demodulator according to claim 8, characterized in that said stubs (STUB1, STUB2) are double and branch in perpendicular direction and in opposed directions from the said relevant microstrips (L1, L2), thus increasing the bandwidth of said frequency mixers (MIX1, MIX2).

11. Sub-harmonic mo-demodulator according to claim 7, characterized in that said diodes in antiparallel (D1, D2) consist of pairs of diodes in series placed in antiparallel.

* * * * *